United States Patent [19]

Ehler

[11] Patent Number: 4,832,249

[45] Date of Patent: May 23, 1989

[54] METHOD AND ARRANGEMENT FOR REFLOW SOLDERING AND REFLOW UNSOLDERING OF CIRCUIT BOARDS

[75] Inventor: Helmut Ehler, Neu-Ulm, Fed. Rep. of Germany

[73] Assignee: Licentia Patent-Verwaltungs-GmbH, Fed. Rep. of Germany

[21] Appl. No.: 68,646

[22] Filed: Jun. 30, 1987

[30] Foreign Application Priority Data

Jul. 3, 1986 [DE] Fed. Rep. of Germany ....... 3622336
Jun. 25, 1987 [DE] Fed. Rep. of Germany ....... 3720912

[51] Int. Cl.$^4$ .......................... B23K 29/00; B23K 1/20
[52] U.S. Cl. ..................................... 228/102; 228/219; 228/232; 228/242; 228/264; 228/7; 228/9; 228/46; 219/411; 219/85.17
[58] Field of Search ............... 228/102, 103, 191, 219, 228/222, 232, 242, 264, 7–9, 20, 46, 180.1, 180.2, 105; 432/18, 37; 219/411, 85 E

[56] References Cited

U.S. PATENT DOCUMENTS

| 3,632,955 | 1/1972 | Cruickshank | 228/180.2 |
| 3,685,139 | 8/1972 | Early et al. | 228/242 |
| 3,710,069 | 1/1973 | Papadopoulos et al. | 228/180.1 |
| 3,926,360 | 12/1975 | Moister, Jr. | 228/180.2 |
| 4,231,508 | 11/1980 | Wagner | 228/242 |
| 4,270,260 | 6/1981 | Krueger | 228/191 |
| 4,364,508 | 12/1982 | Lazzery et al. | 228/180.2 |
| 4,501,072 | 2/1985 | Jacobi, Jr. et al. | 219/411 |
| 4,508,960 | 4/1985 | Arai | 219/411 |
| 4,574,182 | 3/1986 | Pescatore et al. | 228/232 |
| 4,654,502 | 3/1987 | Furtek | 228/180.1 |

OTHER PUBLICATIONS

"Research Disclosure", Solder Process Monitor, No. 258, Oct., 1985.

Primary Examiner—Nicholas P. Godici
Assistant Examiner—Samuel M. Heinrich
Attorney, Agent, or Firm—McGlew and Tuttle

[57] ABSTRACT

Method for reflow soldering respectively desoldering of circuit boards by using infrared radiation from radiator groups in a furnace. The circuit boards are introduced into the furnace on a timed belt or work piece carrier and maintained motionless during the prewarming, soldering respectively desoldering and cooling down phase. For prewarming for a first given time the radiator groups are operated with reduced operating current. For reflow soldering respectively desoldering the operating current of the radiator groups is switched for a second given time to a maaximum given stage and subsequently turned off completely. The soldered respectively desoldered circuit boards are cooled in a laminar air stream from ventilators for drawing off the solder vapors; the ventilators are initially operated with reduced number of rpms until the solder solidifies and then at the maximum number of rpms. Subsequently, the circuit boards are moved out of the furnace.

25 Claims, 4 Drawing Sheets 0,1mm Polymidfilm
30pm Cu, 0,1pm Sn 1,0mm Epoxy-Printed Circuit Board

METHOD AND ARRANGEMENT FOR REFLOW SOLDERING AND REFLOW UNSOLDERING OF CIRCUIT BOARDS

BACKGROUND OF THE INVENTION

This invention relates in general to soldering and in particular to a new and useful method and apparatus for reflow solder and reflow desoldering of circuit boards.

For reflow soldering circuit boards, a variety of infrared through-type furnaces are on the market. These have the following particular disadvantages: if due to a disturbance in the production process (during mounting or solder dosing) the installation must be turned off, it is possible that the material to be soldered is destroyed because of the larger amount of heat stored in the furnace. Furthermore, the material to be soldered is subject to continuous shaking and jarring during the transport in the melting and solidification area, which influence the strength and the metal structure of the solder sites negatively.

Known are, furthermore, halogen point radiators with gold-plated reflector, which are suitable for manually reduced operating voltage for reflow soldering of single soldering sites.

The invention provides a method and device which are suitable for an automatic production line, in which the material to be soldered is not damaged during disturbances of the processing sequences and in which no shaking or jarring motions occur during critical soldering phases.

Accordingly, an object of the invention is to provide a method for reflow soldering and reflow desoldering of circuit boards using infrared radiation from radiator groups in a furnace which comprises introducing the circuit boards in a first phase into the furnace, in a second phase selectively either soldering or desoldering the circuit boards as the case may be, in a third phase removing the boards from the furnace and wherein in a first intermediary phase prewarming the circuit boards in the furnace between the first and second phases, and in a second intermediary phase between the second and third phases cooling the circuit boards while they are still in the furnace and wherein the circuit boards both while they are prewarmed and cooled down in the intermediary phases and in the soldering or desoldering first phases stationary in the furnace; and generating infrared radiation substantially only during the first intermediary phase and the second stage.

A further advantageous consideration of the inventive method is that the infrared radiation is substantially homogeneous and is formed by a multitude of parallel thermal rays arranged in radiator groups which extends perpendicular to respective upper and lower sides of the circuit boards.

A further object of the invention is to provide an apparatus with soldering and desoldering circuit boards which comprises an infrared furnace with a conveyor extending through the furnace having its own drive system which carries the circuit boards past a plurality of infrared area radiators arranged in spaced relationship along the furnace. Each of the radiators have their own regulating circuits for its operating current. Means for generating a gas stream are provided with a horizontal flow direction first to the direction of movement to the conveyor. The furnace has a first duct with a ventilator fan for drawing in the gases on a side of the conveyor and a second ventilator fan for drawing off the gases and the soldering vapors on the other side of the conveyor and wherein each of the ventilating fans has a regulating circuit for driving the fans.

A further object of the invention is to provide a device for soldering and/or desoldering circuit boards which is simply in design, rugged in construction, and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Under the method of the invention, circuit boards 3 of a thickness between approximately 0.1 to approximately 2.5 mm can be soldered. The circuit boards are formed of, for example, hard paper, hard fabrics, epoxy glass hard fabrics, epoxy glass multi layer hard fabrics with, for instance, invar interlayers or of polyimide. Solder paste containing flux agents are applied to the sites to be soldered, the soldering connection of surface mountable devices is made at the site to be soldered by pressing with solder preforms, for example, solder rings over wire connections, etc.

Figure 1:
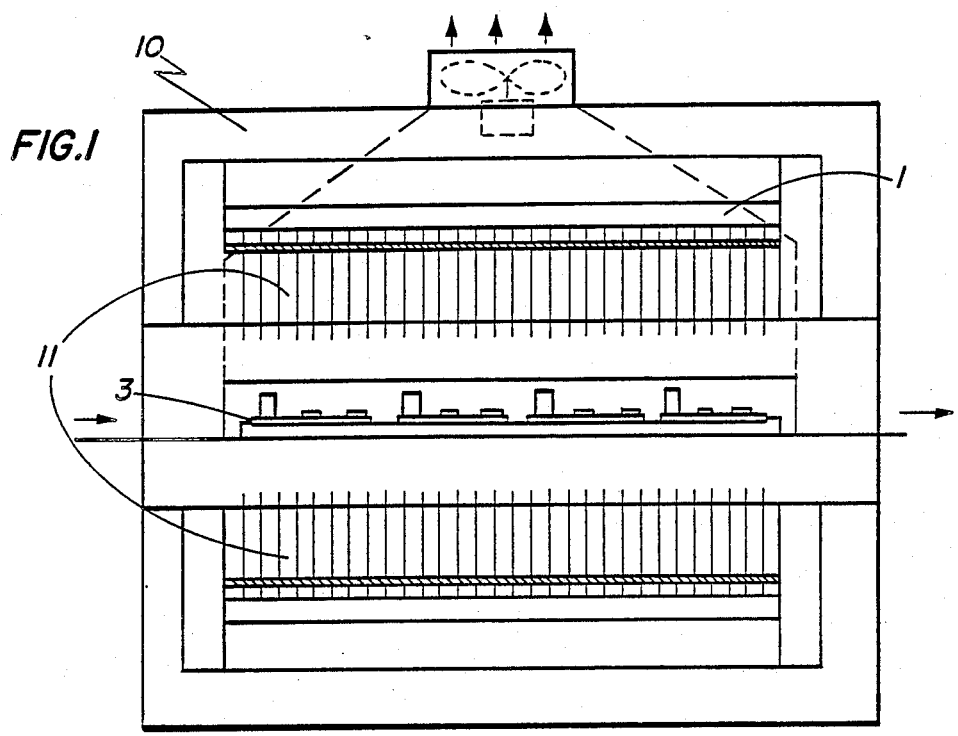
FIG. 1 is a schematic transfer sectional view of a furnace constructed in accordance with the invention.
Figure 2:
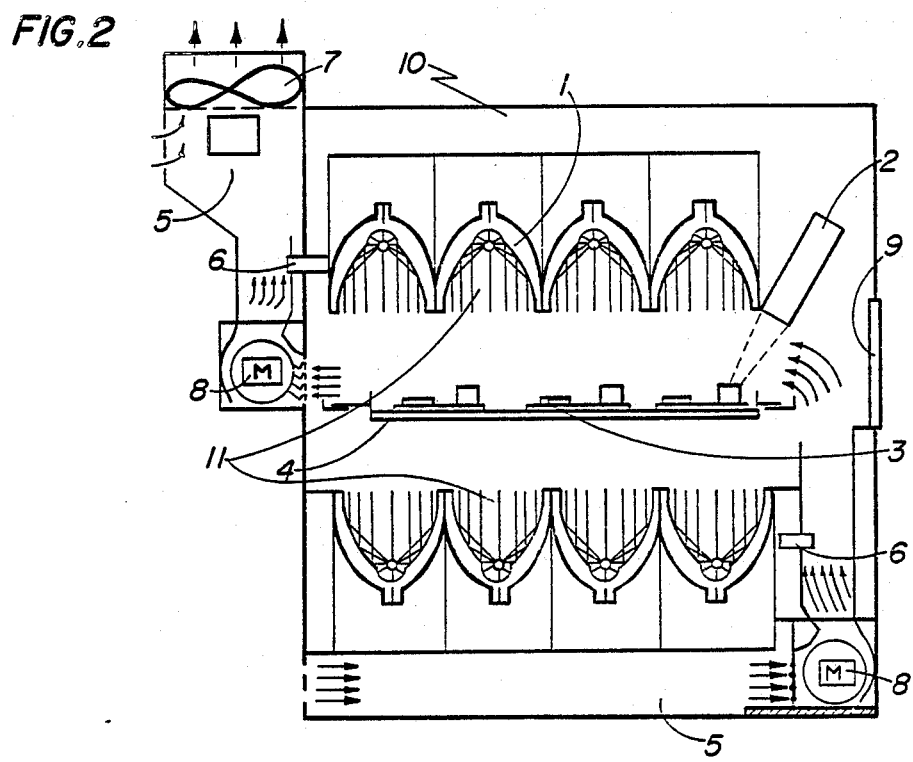
FIG. 2 is a view similar to FIG. 1 taken at the location of the infrared generators.

The mounted circuit boards 3 are moved in a first phase into a furnace 10 by an automatic transporting system, running from left to right as shown in FIG. 1. Work piece carriers 4 of an automatic production line can be utilized. The transporting system is timed during the prewarming and cooling down first and second intermediary phases and during the second phase of soldering or desoldering phases the circuit board 3 are no longer in motion but remain in a fixed position in the furnace 10. In the furnace 10 above and/or below the transport system or conveyor and equidistant to the circuit boards 3 (see FIGS. 1 and 2) several infrared area radiators 1 are placed next to each other and possibly also behind one another. These have parabola-shaped gold-plated reflectors, which ensure uniform distribution of the radiation over the circuit boards 3 with the heat rays generated by the infrared area radiators 1 running nearly parallel and approximately perpendicular to the top and bottom side, respectively, of the circuit boards 3. The infrared (IR) wave length lies preferentially between approximately 1 um and 3 um.

Each of the IR area radiators 1 has a regulating circuit for the operating current. Each individual one has a current sensor, which maintains the selected operating current constant at $+0.5\%$ via a regulating system with phase control. The ventilators or fans 8 for generating a laminar air flow and for drawing off the solder vapors (see FIGS. 1 and 2) also have regulating circuits for their driving motors M. Each of the two ventilators 8 is located in a duct 5. The first of the two ducts 5 has an inlet opening going out and an outlet opening, which is located on one side of the transport system approximately at the same level as the latter. The second of the two ducts 5 has an outlet opening and an inlet opening which is located on the opposing side of the transport system approximately on its level. Near the outlet opening of the second duct 5 in the interior of the duct, a third non-regulated ventilator 7 is located for drawing off the gases and the soldering vapors. In the vicinity of each of the two regulated ventilators 8 in the interior of the associated duct 5 a flow sensor 6 is located, which is part of the regulating circuit for the driving motor M of the associated ventilator 8.

The regulation of the regulated ventilators 8 is set so that the air from the outside is led through the first duct 5 to one side of the transport system. The air subsequently flows in laminar and horizontal manner transversely to the transport direction of the circuit boards 3, past the latter and through the second duct 5 on the other side of the transport system together with the solder vapors to the outside. The third ventilator 7 supports this eduction process with additional air in-draw openings being provided in an advantageous embodiment in front of the ventilator 7 in the outgoing air duct 5.

The rpm of the regulated ventilator 8 and of the non-regulated ventilator 7 respectively and the numbers and sizes of the additional air in-draw openings in the outgoing air duct 5 are so dimensioned, that at least during the pre-warming intermediary phase, and the soldering and desoldering phase as well as during the cooling down intermediary phase up to the solidification of the solder on the circuit boards 3 no negative pressure is generated in the furnace 10.

Moreover, the furnace 10 has in the middle of the side opposing the outgoing air duct 5, approximately at the level of the transporting system as hinged transparent viewing window 9, which permits continuous observation of the process going on in the furnace 10 while allowing the removal of the desoldered structural elements manually (with forceps or grippers) during the desoldering process.

Figure 4:
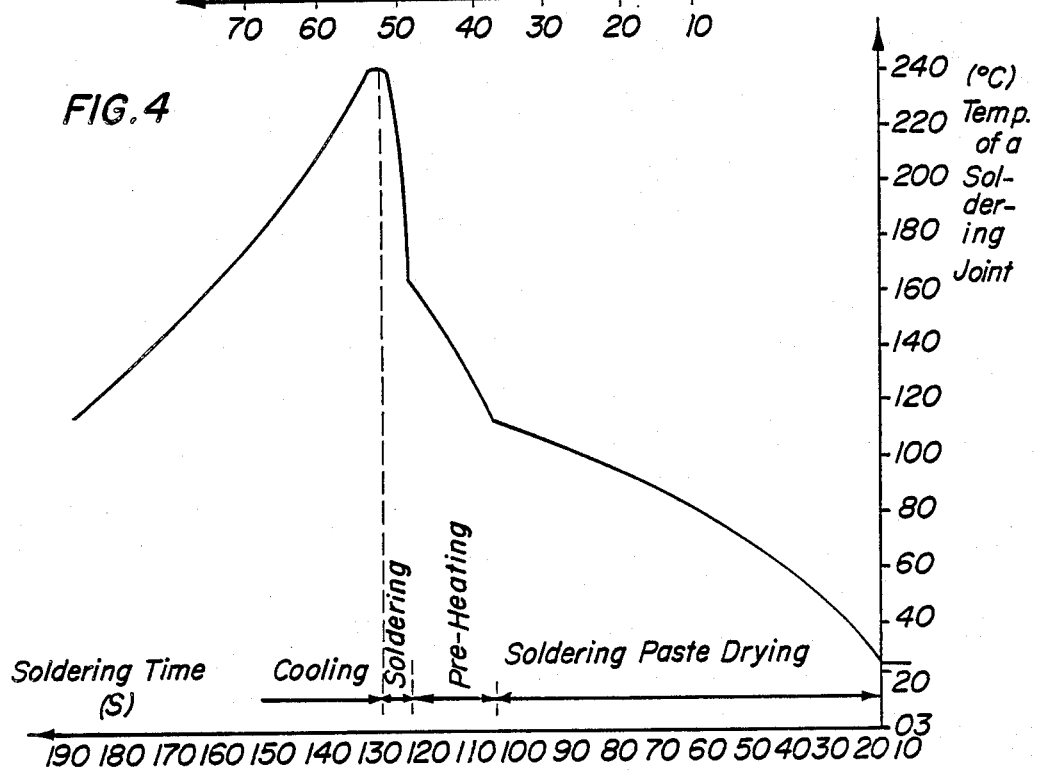
FIGS. 4, 5 and 6 are views similar to FIG. 1 showing other operating stages of circuit boards of varying thicknesses and materials.

A typical processing sequence of reflow soldering according to the invention is described below. In this example, the solder paste drying (driving out the gas) is carried out in the arrangement according to the invention. The associated temperature over time of a selected soldering site is represented in FIG. 4. Initially both radiator groups 1 are turned on and operated with low operating current so that the solder paste dries within 90 seconds and the circuit board 3 and structural elements heat up to approximately 110° C. Subsequently for pre-warming, the operating current is turned up for a given first time of approximately 20 seconds (but compared to the maximum value still on a reduced level) so that the equipped circuit carriers 4 heat up from 100 to approximately 160° C. Now for a second given time from 4 to 8 seconds the operating current of the area radiators 1 is turned to a maximum given stage and subsequently turned off altogether. In this short time the structural elements and the solder sites heat up to approximately 240° C. during which time the soldering paste melts and the structural elements are soldered securely to the solder sites.

The circuit board 3 now cool down to approximately 170° C. in the constant laminar airflow of approximately 0.5 m/s of the ventilators operated at approximately 30% of their rated rpm. The ventilators 8 are subsequently switched to maximum rpm operation, by which process the air flowing past the circuit boards cools the latter rapidly to 60 to 87° C. The transport system with the circuit boards 3 is now timed further to leave the furnace and brought to, for example, a through type cleaning installation.

Figure 3:
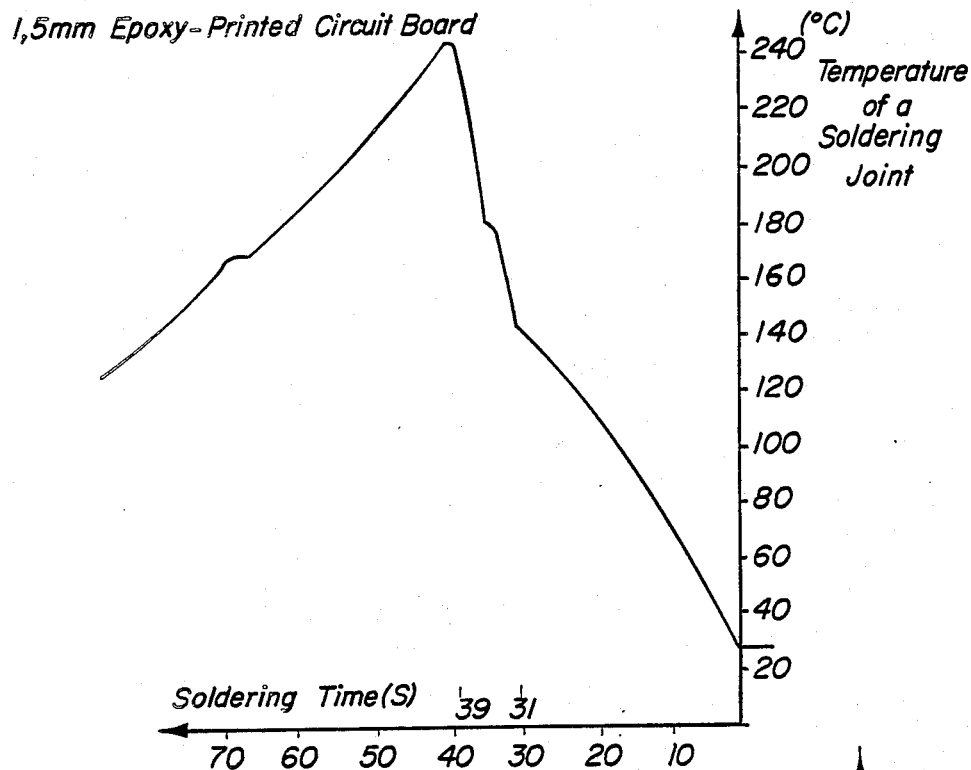
FIG. 3 is a curve showing measured temperatures of soldering sights on the circuit boards of varying thicknesses and materials.
Figure 6:
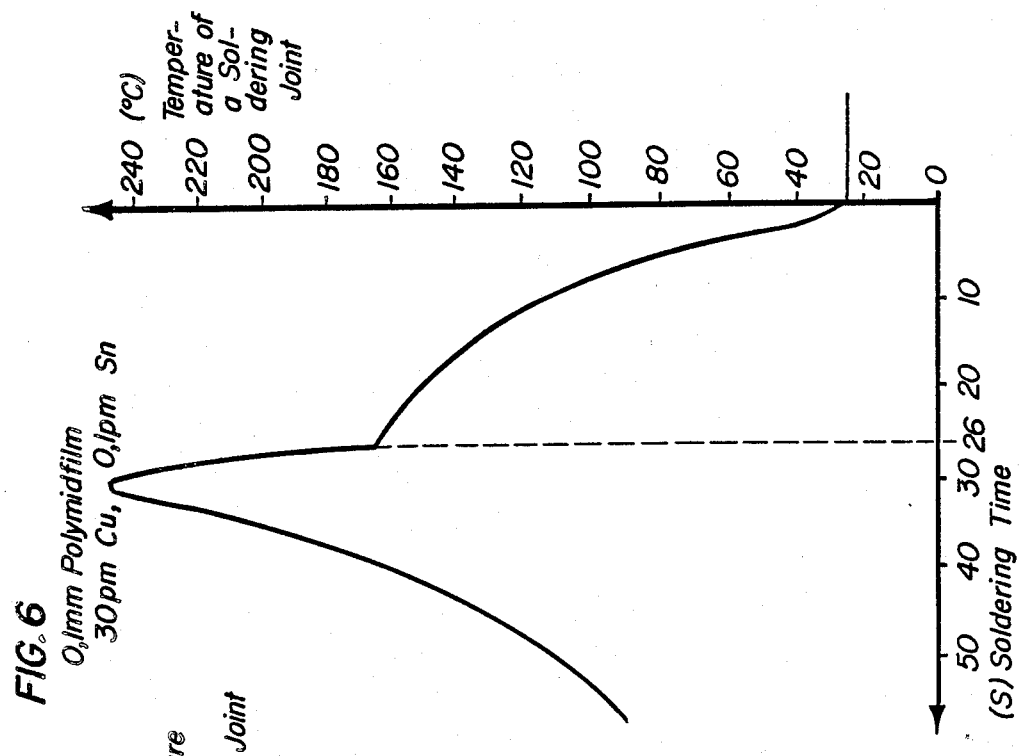
Figure 5:
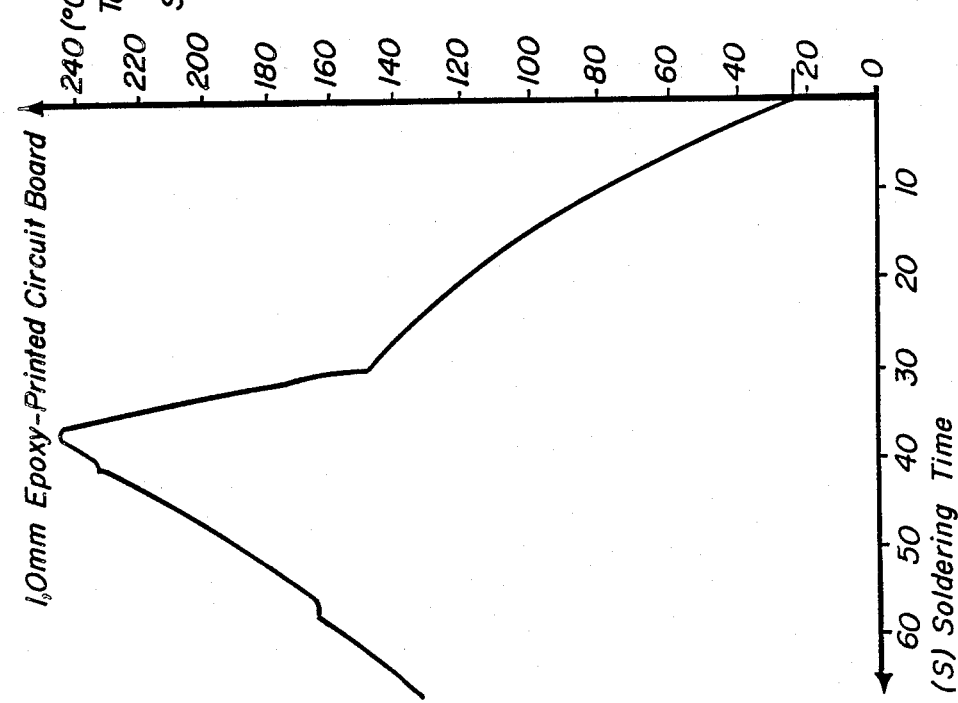

The requisite levels of the operating current and each of the setting times of the individual operating stages must be determined empirically as a function of the material to be soldered. Factors entering into establishing the setting are the thickness of the base material, the mass of the structural elements, soldering type, etc. FIGS. 3, 5 and 6 show solder site temperatures for a variety of circuit board types.

These setting parameters can be stored in a stored-programmable micro control and regulation as soldering programs of the particular circuit board types and called up any time (for example with further soldering or desoldering processes).

To increase the through-put of the solder furnace 10 the solder paste drying can be split from the rest of the process and can take place, for example, in an in-line through-type furnace. Between the two furnaces in this case a compensating loop is provided. When using solder preforms the drying is eliminated, the degree of the prewarming temperature remains the same. The pre-warming time depending on the kind of circuit board is 20 to 40 seconds.

The regulating circuits (preferentially with microprocessor in line) are driven via time circuits (relays) or preferentially via an infrared thermometer ("infrared sensor") 2 (wave length 5 to 8 um or 8 to 12 um). the IR sensor 2 is placed in the furnace 10 (see FIG. 2) and measures during the entire warm-up and cool-down processes the temperature, for example of a structural element or a solder site. It switches the individual operating stages via limiting contacts.

In addition, the ventilators 8 are switched on by the infrared sensor 2, which switches the ventilators 8 on and regulates their rpm, and carries out the timing of the transport system.

When operating fully automatically, for example, in a production line, the circuit board specific setting parameters can be read automatically by a line code or bar code fastened on the work piece carrier 4 or a circuit board 3 and set via setting electronics (for example a stored program microprocessor control and regulation). On a work piece carrier 4, however, the circuit boards 3 must always be of identical type. In temperature-driven operations the additional precautionary step must be taken for determining the temperature that one of the circuit boards 3 to be worked on is always positioned in the location on the work piece carrier 4 which is monitored by the IR sensor.

Below, a typical procedure sequence according to the invention for reflow desoldering is described.

The circuit boards 3 to be processed with the structural parts to be desoldered are brought to a given location in the furnace 10, either through the viewing window 9 or via the timed transport system. The remaining structural elements of the circuit board not to be desoldered are covered with metal sheet (preferentially of uncoated aluminum) from above and below and in this way protected from the IR radiation.

Preferentially during the first and/or sole reflow desoldering solder paste is applied additionally to a solder site of the structural element to be desoldered.

Comparable to the steps during reflow soldering the structural element to be desoldered is initially pre-warmed to a given solder site temperature (approximately 160° C.) and subsequently briefly heated up to the melting temperature of the solder paste (approximately 183° C.). The process is observed through the viewing window 9. When the solder paste melts, the viewing window 9 is opened and the structural element to be desoldered is manually, for example with forceps or grippers, lifted off the circuit board 3 and removed.

If on several identical circuit boards identical structural elements are to be desoldered for the first time, the infrared sensor 2, in an advantageous model of the arrangement according to the invention, is calibrated to the melting temperature of the additionally applied soldering paste (for example, by manually pressing a signal generator, which is connected with the IR sensor 2 respectively its control) and the generation of the IR radiation 11 by the IR radiator 1 in the subsequent soldering processes is controlled directly by the IR sensor 2 without the addition of soldering paste.

It should be understood that the solution according to the invention can be further developed with expert knowledge and abilities and can be adapted to specific applications without discussing this in great detail here.

It is, for example possible to use in the laminar gas stream passing by the circuit boards instead of air in an inert protective gas, for example, nitrogen or helium. It can also be advantageous, to move the gas steam in a closed circulatory system with an external device for cleaning the gases with the furnace being part of this closed circulatory system. It is, furthermore, possible to force-cool the infrared area radiators during the cooling down phase (preferentially after the solder has solidified), down to a given minimal temperature in order to ensure reproducible starting conditions. It can, moreover, be of advantage (particularly during reflow desoldering) not even to turn on the unnecessary infrared area radiators. Lastly, it is possible, to utilize for force-cooling the infrared area radiator the gas stream intended for cooling the circuit boards by conducting part of this gas stream through appropriate flaps and valves to the outside of the reflectors of the area radiators facing away from the circuit boards.

The advantages of the present invention are:

That in the furnace only a relatively small amount of heat is stored, so that, inter alia, when the installation is turned off due to a failure in the production process, the material to be soldered is not destroyed.

That the material to be soldered during the critical melt and solidification phase of the solder is not subjected to shaking and jarring, which would negatively influence strength and metal structure of the soldering sites.

That by using parallel heat rays from above and below, which stand perpendicular on the upper respectively lower side of the circuit board, only the structural elements to be desoldered are desoldered and no shading effects originate so that chip carriers also can be desoldered without problems.

That with the force-cooling of the IR area radiators in the cooling down phase and with the gas stream conducted in laminar flow past the circuit boards together with the radiation field homogeneous in the soldering respectively desoldering location, uniform and reproducible soldering respectively desoldering conditions can be created.

I claim:

1. A method for the selective reflow soldering and/or reflow desoldering of circuit boards using infrared radiation from radiator groups in a furnace, comprising the steps of providing a first phase including introducing the circuit boards to the furnace, providing a second phase including selectively soldering and desoldering the circuit boards, providing a third phase including removing the boards from the furnace, providing a first intermediary phase between the first and second phases including prewarming the circuit boards in the furnace, providing a second intermediary phase between the second and third phase including cooling the circuit boards while they are still in the furnace, maintaining said circuit boards stationary in said furnace both while they are prewarmed and cooled down in said intermediary phases and in said first phase, and generating infrared radiation substantially only during the first intermediary phase and said second phase, wherein the duration of the prewarming and cooling down during said first and intermediary phase and said second phase is determined by given values of the soldering site temperature on the circuit boards such that upon reaching one of these values the particular one of said phases is ended and a succeeding phase is begun.

2. A method according to claim 1 wherein said infrared radiation is substantially homogeneous and is formed by a plurality of radiator groups emitting substantially parallel rays which extend substantially perpendicular to a respective upper and lower side of said circuit boards.

3. A method according to claim 1 wherein the infrared radiation generated by both soldering and desoldering locations in the furnace has a maximum value during the said second phase and during intermediary phases has a value less than the maximum value.

4. A method according to claim 1 including detecting the soldering site temperature on the circuit boards using at least one infrared sensor.

5. A method according to claim 1 wherein for use with soldering paste wherein the circuit boards are passed through an in-line through-type furnace in order to dry the soldering paste.

6. A method according to claim 1 wherein setting parameters in the microprocessor control and regulation are stored and are applicable for soldering and desoldering identical circuit boards and identical structural elements on identical circuit boards.

7. A method for the selective reflow soldering and/or reflow desoldering of circuit boards using infrared radiation from radiator groups in a furnace, comprising the steps of providing a first phase including introducing the circuit boards to the furnace, providing a second phase including selectively soldering and desoldering the circuit boards, providing a third phase including removing the boards from the furnace, providing a first intermediary phase between the first and second phases including prewarming the circuit boards in the furnace, providing a second intermediary phase between the second and third phase including cooling the circuit boards while they are still in the furnace, maintaining said circuit boards stationary in said furnace both while they are prewarmed and cooled down in said intermediary phases and in said first phase, and generating infrared radiation substantially only during the first intermediary phase and said second phase, wherein soldering vapors generated during soldering and unsoldering and cooling down the circuit boards are drawn off by introducing a gas stream past the circuit boards in the furnace.

8. A method according to claim 7, wherein at least during said first intermediary phase and said second phase and said second intermediary phase up to the point of solidification of the solder on the circuit boards, the gas stream is guided past the circuit boards in a laminar flow.

9. A method according to claim 7 wherein the flow rate of of the gas stream is regulated using at least one flow sensor and including regulating the speed of a ventilator fan driving motor so that the flow rate at least during the said first intermediary phase, said second phase and said second intermediary phase and the solidification of the solder on the circuit boards are maintained by a regulating system on a constant value which is smaller than or equal to a given value.

10. A method according to claim 8 wherein the flow rate of said gas stream during the second intermediary phase after solidification of the solder on the circuit board is raised to a value between a given value and to a value equal to a maximum value.

11. A method according to claim 7 wherein said radiator groups during said second intermediary phase are force-cooled to a given minimum temperature.

12. A method for the selective reflow soldering and/or reflow desoldering of circuit boards using infrared radiation from radiator groups in a furnace, comprising the steps of providing a first phase including introducing the circuit boards to the furnace, providing a second phase including selectively soldering and desoldering the circuit boards, providing a third phase including removing the boards from the furnace, providing a first intermediary phase between the first and second phases including prewarming the circuit boards in the furnace, providing a second intermediary phase between the second and third phase including cooling the circuit boards while they are still in the furnace, maintaining said circuit boards stationary in said furnace both while they are prewarmed and cooled down in said intermediary phases and in said first phase, and generating infrared radiation substantially only during the first intermediary phase and said second phase, wherein the circuit boards are moved into the furnace on a timed basis during said first and second intermediary phases and during said second phase are maintained on a stationary work piece carrier, and the radiator groups during the first intermediary phase for a first given time are operated under a reduced operating current, and during said second phase for a second given time are operated under a given maximum operating current and at least one ventilator fan during said first intermediary phase and said second phase and during said intermediary phase and during solidification of the solder on said circuit boards is operated with reduced number of rpm and during the said second intermediary phase after the solder solidifies with the maximum number of rpm, and that after completion of said second intermediary phase the soldered and desoldered circuit boards are removed from the furnace.

13. A method according to claim 12 wherein on a solder site of the structural element to be desoldered on the circuit board, additional solder paste is applied, and the structural element is lifted off and removed only after this soldering paste has melted.

14. A method for the selective reflow soldering and/or reflow desoldering of circuit boards using infrared radiation from radiator groups in a furnace, comprising the steps of providing a first phase including introducing the circuit boards to the furnace, providing as second phase including selectively soldering and desoldering the circuit boards, providing a third phase including removing the boards from the furnace, providing a first intermediary phase between the first and second phases including prewarming the circuit boards in the furnace, providing a second intermediary phase between the second and third phase including cooling the circuit boards while they are still in the furnace, maintaining said circuit boards stationary in said furnace both while they are prewarmed and cooled down in said intermediary phases and in said first phase, and generating infrared radiation substantially only during the first intermediary phase and said second phase, wherein when reflow desoldering of individual structural elements on the circuit boards is carried out, the remaining structural elements which are not intended to be heated, are covered from above and below by a sheet, wherein the structural element to be desoldered is manually lifted off and removed after the solder has melted.

15. An apparatus for soldering and desoldering circuit boards, comprising an infrared furnace having an opening at each end, a circuit board conveyor arranged to move through the openings and through said furnace, said furnace having a plurality of infrared area radiators arranged in spaced relationship along said furnace, each of said area radiators having a separate regulating circuit for its operating current, means in said furnace for generating a gas stream with a horizontal flow direction transverse to the direction of movement of said conveyor, a first duct in said furnace with a first motor driven ventilator fan for drawing gases on one side of said conveyor, a second motor driven ventilator fan for drawing off the gases and soldering vapors arranged on the other side of said conveyor from said first motor driven ventilator fan, and a fan regulating circuit connected to each of said motor driven fans for regulating the driving motors of said fans, wherein the regulating circuit for the motor driven fans contains at least one flow sensor in said duct.

16. An apparatus according to claim 15 wherein the means for circulating gas comprises an inert gas and particularly nitrogen.

17. An apparatus according to claim 16 wherein said gas is led into a closed circulatory system through said furnace and said system has an external device for cleaning said gas.

18. An apparatus according to claim 15 wherein said regulating circuits include variable time circuits.

19. An apparatus according to claim 15 wherein an infrared thermometer is located in said furnace and said infrared thermometer controls said regulating circuit.

20. An apparatus according to claim 15 wherein said regulating circuits include time circuit and bar code reading means for adjusting the level of operating current in response to bar codes on said conveyor and on said circuit boards.

21. An apparatus according to claim 15 wherein said furnace has a middle wall comprising a view window which is arranged opposite said duct approximately on the level of said conveyor.

22. An apparatus according to claim 21 wherein said viewing window is formed of a transparent material.

23. An apparatus according to claim 22 wherein for controlling and regulating the said process a stored-programmable compressor controlled and regulation is provided.

24. An apparatus according to claim 15 wherein sheets are provided for covering said circuit boards during reflow on soldering which includes uncoated aluminum sheet metal.

25. An apparatus for soldering and desoldering circuit boards, comprising an infrared furnace, having an opening at each end, a circuit board conveyor arranged to move through the openings and through said furnace, said furnace having a plurality of infrared area radiators arranged in spaced relationship along said furnace, each of said area radiators having a separate regulating circuit for its operating current, means in said furnace for generating a gas stream with a horizontal flow direction transverse to the direction of movement of said conveyor, a first duct in said furnace with a first motor driven ventilator fan for drawing gases on one side of said conveyor, a second motor driven ventilator fan for drawing off the gases and soldering vapors arranged on the other side of said conveyor from said first motor driven ventilator fan, and a fan regulating circuit connected to each of said motor driven fans for regulating the driving motors of said fans, wherein said duct has an exit for the purpose of the drawing off of said gases and soldering vapors and including an additional non-regulated motor driven ventilator fan located in said duct and including in said duct a channel having additional openings for drawing in outside air.

* * * * *